United States Patent
Rim (10) Patent No.: US 12,438,127 B2
(45) Date of Patent: Oct. 7, 2025

(54) SEMICONDUCTOR DEVICE

(71) Applicant: SK hynix Inc., Gyeonggi-do (KR)

(72) Inventor: Da Il Rim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 339 days.

(21) Appl. No.: 18/187,628

(22) Filed: Mar. 21, 2023

(65) Prior Publication Data

US 2024/0088097 A1 Mar. 14, 2024

(30) Foreign Application Priority Data

Sep. 14, 2022 (KR) .......................... 10-2022-0115504

(51) Int. Cl.
 *H01L 25/065* (2023.01)
 *H01L 21/768* (2006.01)
 *H10B 80/00* (2023.01)

(52) U.S. Cl.
 CPC .... *H01L 25/0657* (2013.01); *H01L 21/76877* (2013.01); *H01L 21/76897* (2013.01); *H10B 80/00* (2023.02)

(58) Field of Classification Search
 CPC ........... H01L 25/0657; H01L 21/76877; H01L 21/76897; H10B 80/00
 See application file for complete search history.

(56) References Cited

U.S. PATENT DOCUMENTS

| | | | | |
|---|---|---|---|---|
| 10,665,581 B1 * | 5/2020 | Zhou | ........................ | H01L 24/43 |
| 11,398,412 B2 * | 7/2022 | Seo | ........................ | H01L 22/32 |
| 11,925,018 B2 * | 3/2024 | Lee | ........................ | H10B 43/10 |
| 11,967,574 B2 * | 4/2024 | Hwang | .................... | H01L 25/50 |
| 12,144,170 B2 * | 11/2024 | Lee | ........................ | H10B 43/40 |
| 12,272,661 B2 * | 4/2025 | Lee | ........................ | H01L 24/06 |
| 2009/0294977 A1 * | 12/2009 | Jao | .......................... | H01L 24/06 257/773 |
| 2014/0367853 A1 * | 12/2014 | Tsukimura | ............ | H10F 39/809 257/737 |
| 2020/0357784 A1 * | 11/2020 | Park | ....................... | H10B 41/50 |
| 2022/0013419 A1 * | 1/2022 | Seo | .......................... | H01L 24/02 |

(Continued)

FOREIGN PATENT DOCUMENTS

| | | | | | |
|---|---|---|---|---|---|
| CN | 101599439 B | * | 6/2012 | ............. | H01L 24/06 |
| CN | 113972188 A | * | 1/2022 | ............. | H01L 24/02 |
| CN | 114446933 A | * | 5/2022 | ......... | H01L 23/5386 |
| CN | 115868023 A | * | 3/2023 | ............. | H01L 23/52 |

(Continued)

*Primary Examiner* — Laura M Menz
(74) *Attorney, Agent, or Firm* — IP & T GROUP LLP (57) ABSTRACT

A semiconductor device includes: a first semiconductor structure including a first semiconductor substrate, one or more first conductive patterns, a plurality of first conductive plugs, and a first bonding pad; a second semiconductor structure including a second semiconductor substrate, a plurality of second conductive patterns, one or more second conductive plugs, and a second bonding pad; and two through electrodes penetrating the second semiconductor substrate and respectively connected to two second conductive patterns positioned at opposite ends of the plurality of second conductive patterns, wherein the second bonding pad is bonded to the first bonding pad so that the plurality of second conductive patterns, the one or more second conductive plugs, the second bonding pad, the first bonding pad, the plurality of first conductive plugs, and the one or more first conductive patterns form a daisy chain.

13 Claims, 7 Drawing Sheets

(56) References Cited

U.S. PATENT DOCUMENTS

| | | | | |
|---|---|---|---|---|
| 2022/0122933 A1* | 4/2022 | Hwang | | H01L 25/18 |
| 2022/0139939 A1* | 5/2022 | Lee | | H10B 43/20 |
| | | | | 257/314 |
| 2022/0359439 A1* | 11/2022 | Lee | | H01L 24/16 |
| 2023/0209826 A1* | 6/2023 | Yook | | H10B 43/50 |
| | | | | 257/324 |
| 2023/0352401 A1* | 11/2023 | Sharangpani | | H10B 43/10 |
| 2024/0079362 A1* | 3/2024 | Park | | H01L 24/08 |
| 2024/0088097 A1* | 3/2024 | Rim | | H01L 25/18 |
| 2024/0172435 A1* | 5/2024 | Lee | | H10B 41/35 |
| 2024/0250070 A1* | 7/2024 | Kim | | H01L 25/50 |
| 2024/0332258 A1* | 10/2024 | Rim | | H01L 25/50 |
| 2025/0040126 A1* | 1/2025 | Kim | | H10B 12/482 |
| 2025/0079403 A1* | 3/2025 | Lin | | H01L 24/80 |
| 2025/0157980 A1* | 5/2025 | Seol | | H01L 25/0657 |

FOREIGN PATENT DOCUMENTS

| | | | | | |
|---|---|---|---|---|---|
| CN | 117637690 A | * | 3/2024 | | H10D 84/80 |
| CN | 117712082 A | * | 3/2024 | | H10B 80/00 |
| CN | 117712095 A | * | 3/2024 | | H10B 80/00 |
| CN | 118159027 A | * | 6/2024 | | H01L 25/0657 |
| CN | 118712170 A | * | 9/2024 | | H01L 21/76895 |
| CN | 119364760 A | * | 1/2025 | | H10B 12/482 |
| EP | 4343840 A2 | * | 3/2024 | | H10B 80/00 |
| KR | 10-2020-0037444 A | | 4/2020 | | |
| KR | 20220006295 A | * | 1/2022 | | H01L 24/02 |
| KR | 20220060382 A | * | 5/2022 | | H01L 23/5386 |
| KR | 20240024675 A | * | 2/2024 | | H01L 21/76898 |
| KR | 20240036898 A | * | 3/2024 | | H10B 80/00 |
| KR | 20240109518 A | * | 7/2024 | | H10F 39/811 |
| KR | 20240145170 A | * | 10/2024 | | H01L 21/76895 |
| KR | 20250015208 A | * | 2/2025 | | H10B 12/482 |
| KR | 20250070678 A | * | 5/2025 | | H01L 25/18 |

* cited by examiner

SEMICONDUCTOR DEVICE

CROSS-REFERENCE TO RELATED APPLICATION

This application claims priority under 35 U.S.C. § 119 to Korean Patent Application No. 10-2022-0115504 filed on Sep. 14, 2022, which is incorporated herein by reference in its entirety.

BACKGROUND

1. Technical Field

This patent document relates to a semiconductor technology, and particularly, a semiconductor device including two or more stacked semiconductor structures.

2. Related Art

Electronic products require high-capacity data processing even though their volumes are getting smaller. Accordingly, semiconductor structures such as semiconductor chips and wafers used in these electronic products are also required to be thin and small. Furthermore, embedding a plurality of semiconductor structures in one semiconductor device is being implemented.

A plurality of semiconductor structures may be electrically connected to each other while being stacked in a vertical direction.

SUMMARY

In an embodiment, a semiconductor device may include: a first semiconductor structure including a first semiconductor substrate, one or more first conductive patterns disposed over the first semiconductor substrate, a plurality of first conductive plugs connected to each of the one or more first conductive patterns thereover, and a first bonding pad connected to each of the plurality of first conductive plugs thereover; a second semiconductor structure including a second semiconductor substrate, a plurality of second conductive patterns disposed under the second semiconductor substrate, one or more second conductive plugs connected to each of the plurality of second conductive patterns thereunder, and a second bonding pad connected to each of the one or more second conductive plugs thereunder; and two through electrodes penetrating the second semiconductor substrate and respectively connected to two second conductive patterns positioned at opposite ends of the plurality of second conductive patterns, wherein the second bonding pad is bonded to the first bonding pad so that the plurality of second conductive patterns, the one or more second conductive plugs, the second bonding pad, the first bonding pad, the plurality of first conductive plugs, and the one or more first conductive patterns form a daisy chain.

In another embodiment, a semiconductor device may include: a first semiconductor structure including a first bonding pad; and a second semiconductor structure including a second bonding pad electrically connected to the first bonding pad, wherein the first bonding pad includes a plurality of first sub-bonding pads separated from each other, wherein the second bonding pad includes a plurality of second sub-bonding pads separated from each other, and wherein at least one of the plurality of first sub-bonding pads and at least one of the plurality of second sub-bonding pads are bonded to each other.

DETAILED DESCRIPTION

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

In the following description, a semiconductor structure may mean a semiconductor chip, wafer, or the like, including a circuit and/or wiring structure performing a predetermined function. Also, a semiconductor device may include two or more semiconductor structures that are stacked in a vertical direction and electrically connected to each other. Hereinafter, it will be described in more detail with reference to the drawings.

Figure 1A:
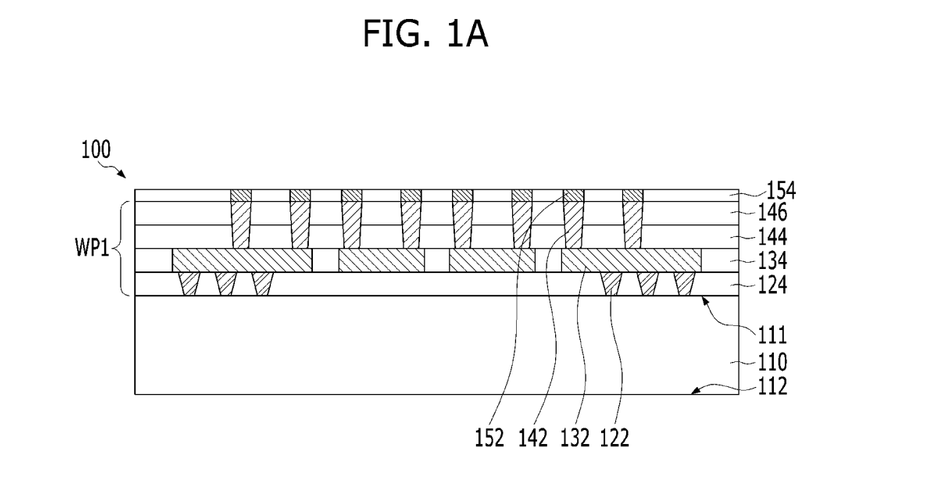
FIG. 1A is a cross-sectional view illustrating a first semiconductor structure according to an embodiment of the present disclosure.
Figure 1B:
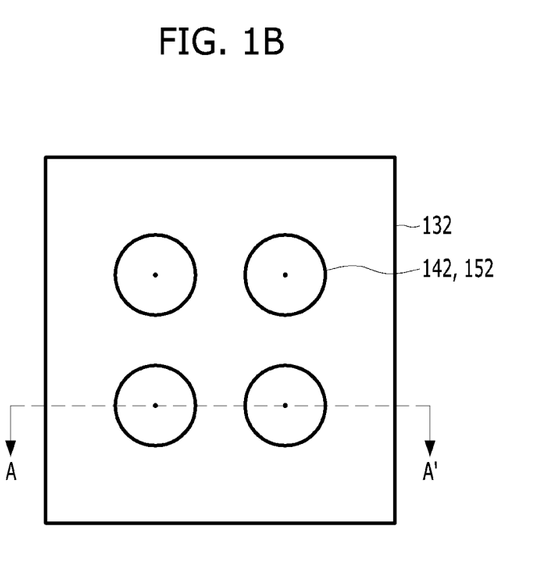
FIG. 1B is a plan view illustrating one first conductive pattern of the first semiconductor structure of FIG. 1A and a first conductive plug/first bonding pad connected thereto.

FIG. 1A is a cross-sectional view illustrating a first semiconductor structure according to an embodiment of the present disclosure, and FIG. 1B is a plan view illustrating one first conductive pattern of the first semiconductor structure of FIG. 1A and a first conductive plug/first bonding pad connected thereto. The cross-sectional view of FIG. 1A is taken along a line A-A' of FIG. 1B.

Referring to FIGS. 1A and 1B, a first semiconductor structure 100 of the present embodiment may include a first semiconductor substrate 110, a first wiring part WP1 disposed over the first semiconductor substrate 110, and a first bonding pad 152 and a first insulating layer 154 disposed over the first wiring part WP1.

The first semiconductor substrate 110 may include a semiconductor material such as silicon or germanium, and may have a first surface 111, a second surface 112, and a side surface connecting them to each other. The first surface 111 may correspond to a front surface and/or an active surface on which the first wiring part WP1 is disposed, and the second surface 112 may correspond to a rear surface and/or an inactive surface positioned opposite to the front surface.

The first wiring part WP1 may be disposed over the first surface 111 of the first semiconductor substrate 110. The first wiring part WP1 may include a circuit and/or wiring structure performing various functions, and may be formed of a combination of one or more insulating layers and one or more conductive layers. For example, in the present embodiment, the first wiring part WP1 may include a conductive structure forming a daisy chain connection structure together with a conductive structure of a second wiring part (see WP2 of FIG. 2A) to be described later. For example, the first wiring part WP1 may include a connection pattern 122, a first conductive pattern 132, and a first conductive plug 142 that are vertically stacked from the first surface 111 of the first semiconductor substrate 110.

One or more first conductive patterns 132 may be formed. When a plurality of first conductive patterns 132 are formed, they may be spaced apart from each other along a cross-sectional direction, that is, a direction parallel to the line A-A', while being positioned at the same level in the vertical direction. Hereinafter, for convenience of description, a direction parallel to the first surface 111 of the first semiconductor substrate 110 and parallel to the line A-A' will be referred to as a first direction, and a direction parallel to the first surface 111 of the first semiconductor substrate 110 and perpendicular to the line A-A' will be referred to as a second direction. Although the case in which four first conductive patterns 132 are arranged in the first direction has been described in the present embodiment, the present disclosure is not limited thereto. As long as the number of the first conductive patterns 132 is one or more, the number and arrangement of the first conductive patterns 132 may be variously modified. The first conductive pattern 132 may have a plate shape in a plan view. The sizes of the first conductive patterns 132 in a plan view may be the same, or at least one of the sizes of the first conductive patterns 132 may be different from another one. For example, as shown in this drawing, the size of each of two first conductive patterns 132 positioned at both ends in the first direction may be larger than that of another first conductive pattern 132.

A plurality of first conductive plugs 142 connected to respective first conductive patterns 132 may be disposed over respective first conductive patterns 132. In the present embodiment, each first conductive pattern 132 may be connected to 2*2, that is, four first conductive plugs 142 that are arranged along the first and second directions. However, the present disclosure is not limited thereto, and the plurality of first conductive plugs 142 may be arranged in various forms. The plurality of first conductive plugs 142 may be positioned at the same level as each other in the vertical direction. The first conductive plug 142 may have a columnar shape, and may have a smaller size than the first conductive pattern 132 in a plan view.

At least one connection pattern 122 may be connected to at least one first conductive pattern 132, and may be disposed thereunder. In the present embodiment, three connection patterns 122 may be disposed under each of two first conductive patterns 132 positioned at both ends in the first direction. However, the present disclosure is not limited thereto. For example, the location and number of the connection patterns 122 may be variously modified as long as the connection pattern 122 electrically connects the at least one first conductive pattern 132 and the first semiconductor substrate 110. The connection pattern 122 may have a columnar shape, and may have a size smaller than that of the first conductive pattern 132 in a plan view.

The connection pattern 122, the first conductive pattern 132, and the first conductive plug 142 may be buried in a plurality of interlayer insulating layers 124, 134, 144, and 146. In the present embodiment, four interlayer insulating layers 124, 134, 144, and 146 are illustrated, but the number of interlayer insulating layers may be variously modified.

The first wiring part WP1 may further include a circuit and/or wiring structure variously implemented according to the function or type of the first semiconductor structure 100, in addition to the connection pattern 122, the first conductive pattern 132, and the first conductive plug 142. For example, when the first semiconductor structure 100 is a memory chip including a volatile memory such as DRAM (Dynamic Random Access Memory) or SRAM (Static RAM), a non-volatile memory such as NAND flash, RRAM (Resistive RAM), PRAM (Phase-change RAM), MRAM (Magneto-resistive RAM), or FRAM (ferroelectric RAM), or the like, the first wiring part WP1 may include a memory cell array including a plurality of memory cells. Alternatively, for example, when the first semiconductor structure 100 is a logic chip or controller including a peripheral circuit for driving a memory, the first wiring part WP1 may include the peripheral circuit.

The first bonding pad 152 may be formed to overlap and connect to each first conductive plug 142 over each first conductive plug 142, and thus, a plurality of first bonding pads 152 may be arranged at the same or substantially the same, location as the first conductive plugs 142 in a plan view. In the present embodiment, the first bonding pad 152 may have the same shape and size as the first conductive plug 142 in a plan view. However, the present disclosure is not limited thereto, and the first bonding pad 152 and the first conductive plug 142 may have different shapes and/or sizes as long as they overlap and connect to each other. The first bonding pad 152 may be for electrically connecting the first semiconductor structure 100 to a second semiconductor structure (see 200 of FIG. 2A) to be described later. The first bonding pad 152 may include various conductive materials, and may have a single-layer structure or a multi-layer structure. For example, when the first bonding pad 152 is directly bonded to a second bonding pad (see 252 of FIGS. 2A and 2B) of the second semiconductor structure to be described later to form a hybrid-bonding structure, the first bonding pad 152 may include a metal material that can be bonded to the second bonding pad 252 by metal interdiffusion through a high-temperature annealing process. For example, the first bonding pad 152 may include a metal such as copper (Cu), nickel (Ni), tin (Sn), gold (Au), or silver (Ag), a combination thereof, or a compound thereof.

The first insulating layer 154 may be formed to fill a space between the plurality of first bonding pads 152 over the first wiring part WP1. The first insulating layer 154 may include various insulating materials. For example, when the first insulating layer 154 is directly bonded to a second insulating layer (see 254 of FIG. 2A) of the second semiconductor structure (200 of FIG. 2A) to form a hybrid-bonding structure, the first insulating layer 154 may include an insulating material capable of being combined with the second insulating layer by a covalent bond between the insulating materials. For example, the first insulating layer 154 may include silicon oxide or silicon nitride.

Figure 2A:
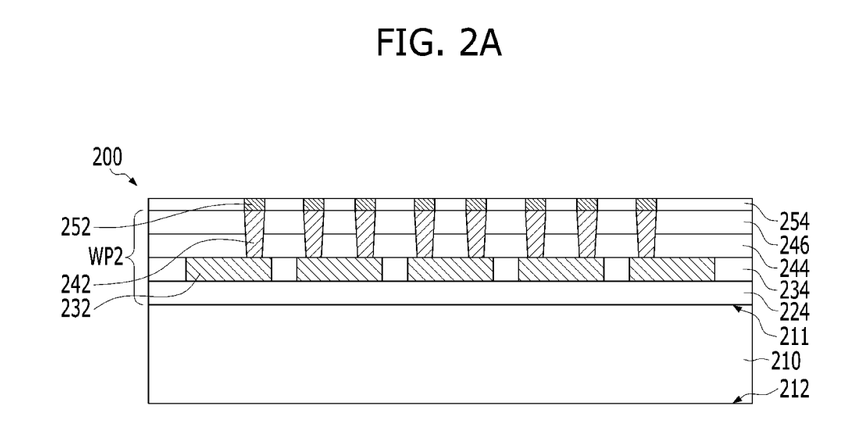
FIG. 2A is a cross-sectional view illustrating a second semiconductor structure according to an embodiment of the present disclosure.
Figure 2B:
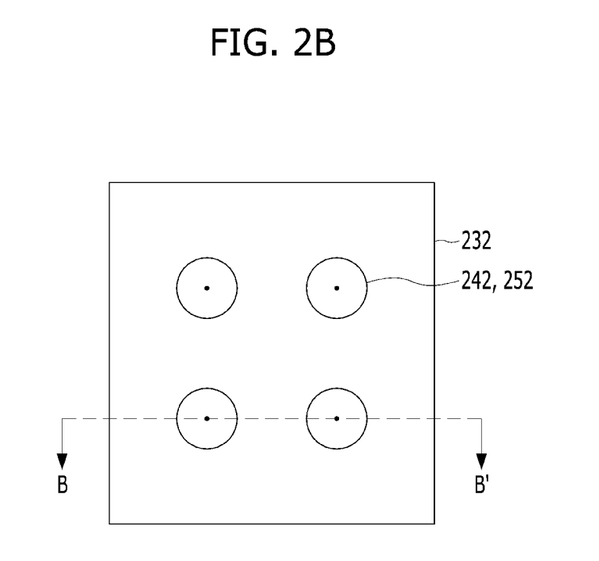
FIG. 2B is a plan view illustrating one second conductive pattern of the second semiconductor structure of FIG. 2A and a second conductive plug/second bonding pad connected thereto.

FIG. 2A is a cross-sectional view illustrating a second semiconductor structure according to an embodiment of the present disclosure, and FIG. 2B is a plan view illustrating one second conductive pattern of the second semiconductor structure of FIG. 2A and a second conductive plug/second bonding pad connected thereto. The cross-sectional view of FIG. 2A is taken along a line B-B' of FIG. 2B.

Referring to FIGS. 2A and 2B, a second semiconductor structure 200 of the present embodiment may include a second semiconductor substrate 210, a second wiring part WP2 disposed over the second semiconductor substrate 210, and a second bonding pad 252 and a second insulating layer 254 disposed over the second wiring part WP2.

The second semiconductor substrate 210 may include a semiconductor material such as silicon or germanium, and may have a first surface 211, a second surface 212, and a side surface connecting them to each other. The first surface 211 may correspond to a front surface and/or an active surface on which the second wiring part WP2 is disposed, and the second surface 212 may correspond to a rear surface and/or an inactive surface located opposite to the front surface.

The second wiring part WP2 may be disposed over the first surface 211 of the second semiconductor substrate 210. The second wiring part WP2 may include a circuit and/or wiring structure performing various functions. The second wiring part WP2 may be formed of a combination of one or more insulating layers and one or more conductive layers. For example, in the present embodiment, the second wiring part WP2 may include a conductive structure forming a daisy chain connection structure together with the first conductive pattern 132 and the first conductive plug 142 of the first wiring part WP1. For example, the second wiring part WP2 may include a second conductive pattern 232 and a second conductive plug 242 that are stacked in a vertical direction from the first surface 211 of the second semiconductor substrate 210.

A plurality of second conductive patterns 232 may be formed. The plurality of second conductive patterns 232 may be spaced apart from each other along the first direction while being positioned at the same level in the vertical direction. In the present embodiment, five second conductive patterns 232 may be arranged in the first direction. However, the present disclosure is not limited thereto, and the number of the second conductive patterns 232 may be variously modified. For example, the number of the second conductive patterns 232 may be greater than the number of first conductive patterns 132 by one. The second conductive pattern 232 may have a plate shape in a plan view. The sizes of the second conductive patterns 232 in a plan view may be the same, or at least one of the sizes of the second conductive patterns 232 may be different from another one. For example, as shown in this drawing, the five second conductive patterns 232 may have the same size.

Two or more second conductive plugs 242 may be connected to each of the second conductive patterns 232, except for two second conductive patterns 232 positioned at both ends in the first direction. In the present embodiment, each of the second conductive patterns 232, except the two second conductive patterns 232 positioned at both ends, may be connected to 2*2, that is, four second conductive plugs 242 that are arranged along the first and second directions. However, the present disclosure is not limited thereto, and the number of the second conductive plugs 242 may be arranged in various forms. At least one second conductive plug 242 may be connected to each of the two second conductive patterns 232 positioned at both ends in the first direction, over each of the two second conductive patterns 232. As will be described later, since the two second conductive patterns 232 positioned at both ends in the first direction correspond to the start and end points of the daisy chain, respectively, each of the two second conductive patterns 232 may be electrically connected to a corresponding first conductive pattern 132. A plurality of second conductive plugs 242 may be located at the same level as each other in the vertical direction. The second conductive plug 242 may have a columnar shape, and may have a smaller size than the second conductive pattern 232 in a plan view.

The second conductive pattern 232 and the second conductive plug 242 may be buried in a plurality of interlayer insulating layers 224, 234, 244, and 246. Here, the second conductive pattern 232 may be formed over the lowermost interlayer insulating layer 224 to be electrically insulated from the second semiconductor substrate 210. In the present embodiment, four interlayer insulating layers 224, 234, 244, and 246 are shown, but the number of interlayer insulating layers may be variously modified.

The second wiring part WP2 may include a circuit and/or wiring structure that is implemented in various ways according to the function or type of the second semiconductor structure 200, in addition to the second conductive pattern 232 and the second conductive plug 242. For example, when the second semiconductor structure 200 is a memory chip including a volatile memory or a non-volatile memory, the second wiring part WP2 may include a memory cell array including a plurality of memory cells. Alternatively, for example, when the second semiconductor structure 200 is a logic chip or controller including a peripheral circuit for driving a memory, the second wiring part WP2 may include the peripheral circuit. The second semiconductor structure 200 may be of the same type as the first semiconductor structure 100. For example, the first and second semiconductor structures 100 and 200 may include the same type of memory. Alternatively, the second semiconductor structure 200 may be of a different type from the first semiconductor structure 100. For example, the first and second semiconductor structures 100 and 200 may include different types of memories, or one of the first and second semiconductor structures 100 and 200 may include a memory and the other of the first and second semiconductor structures 100 and 200 may include a peripheral circuit.

The second bonding pad 252 may be formed to overlap and connect to each second conductive plug 242 and be disposed over each second conductive plug 242, and thus, a plurality of second bonding pads 252 may be arranged at the same or substantially the same, location as the second conductive plugs 242 in a plan view. In the present embodiment, the second bonding pad 252 may have the same shape and size as the second conductive plug 242 in a plan view. However, the present disclosure is not limited thereto, and the second bonding pad 252 and the second conductive plug 242 may have different shapes and/or sizes as long as they overlap and connect to each other. The second bonding pad 252 may be for electrically connecting the second semiconductor structure 200 to the aforementioned first semiconductor structure 100. The second bonding pad 252 may include various conductive materials, and may have a single-layer structure or a multi-layer structure. For example, when the second bonding pad 252 is directly bonded to the first bonding pad 152 of the first semiconductor structure 100 described above to form a hybrid-bonding structure, the second bonding pad 252 may include a metal material that can be bonded to the first bonding pad 152 by metal interdiffusion through a high-temperature annealing process. For example, the second bonding pad 252 may include a metal such as copper (Cu), nickel (Ni), tin (Sn), gold (Au), or silver (Ag), a combination thereof, or a compound thereof.

The second insulating layer 254 may be formed to fill a space between the second bonding pads 252 over the second wiring part WP2. The second insulating layer 254 may include various insulating materials. For example, when the second insulating layer 254 is directly bonded to the first insulating layer 154 of the first semiconductor structure 100 to form a hybrid-bonding structure, the second insulating layer 254 may include an insulating material capable of being combined with the first insulating layer 154 by a covalent bond between the insulating materials. For example, the second insulating layer 254 may include silicon oxide or silicon nitride.

The first semiconductor structure 100 and the second semiconductor structure 200 may be bonded to each other in which the first bonding pad 152 and the second bonding pad 252 face each other and the first insulating layer 154 and the second insulating layer 254 face each other. For example, the second semiconductor structure 200 may be disposed over and bonded to the first semiconductor structure 100 in which the first surface 211 of the second semiconductor substrate 210 faces downward and the second surface 212 of the semiconductor substrate 210 faces upward. This embodiment will be described with reference to FIGS. 3A and 3B.

Figure 3A:
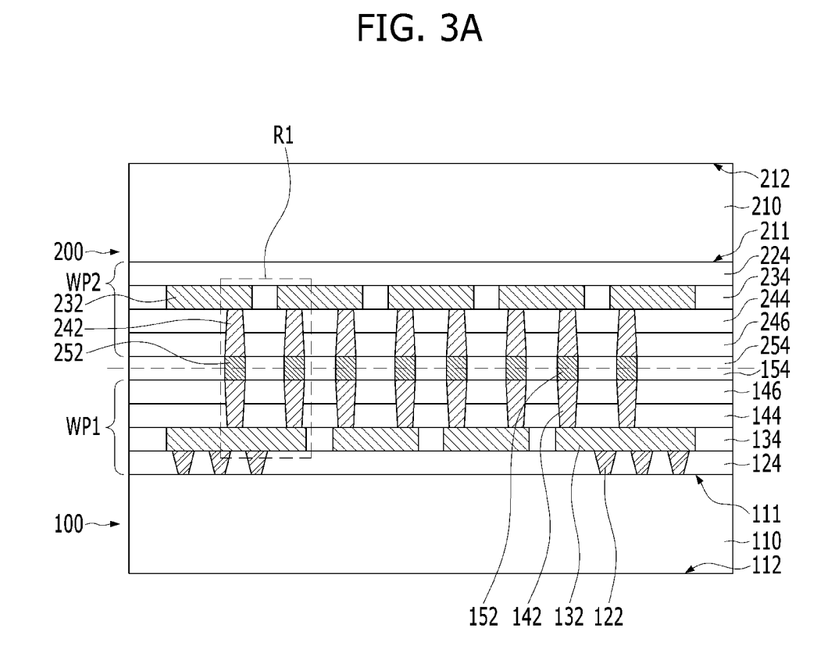
FIG. 3A is a cross-sectional view illustrating a semiconductor device in which the first semiconductor structure of FIG. 1A and the second semiconductor structure of FIG. 2B are stacked.
Figure 3B:
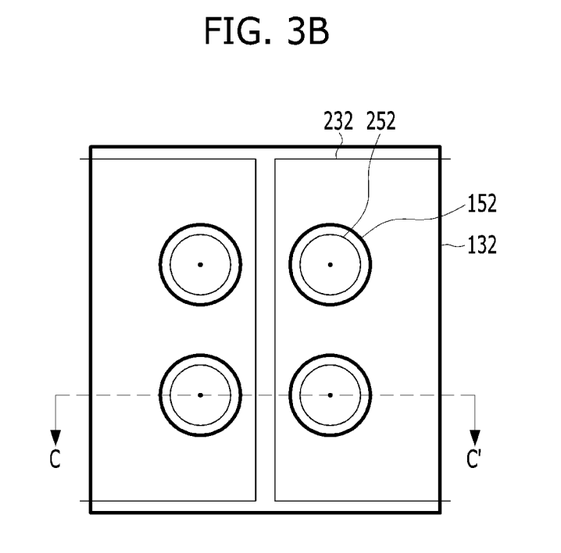
FIG. 3B is a plan view corresponding to a part R1 of FIG. 3A

FIG. 3A is a cross-sectional view illustrating a semiconductor device in which the first semiconductor structure of FIG. 1A and the second semiconductor structure of FIG. 2B are stacked, and FIG. 3B is a plan view corresponding to a part R1 of FIG. 3A. The part R1 of FIG. 3A is taken along a line C-C' of FIG. 3B.

Referring to FIGS. 3A and 3B, a semiconductor device of the present embodiment may include the first semiconductor structure 100 and the second semiconductor structure 200 disposed over the first semiconductor structure 100.

The second bonding pad 252 of the second semiconductor structure 200 may be directly bonded to the first bonding pad 152 of the first semiconductor structure 100, and the second insulating layer 254 of the second semiconductor structure 200 may be directly bonded to the first insulating layer 154 of the first semiconductor structure 100. For this, a high-temperature annealing process may be performed in which the first bonding pad 152 and the first insulating layer 154 of the first semiconductor structure 100 contact the second bonding pad 252 and the second insulating layer 254 of the second semiconductor structure 200, respectively. During the high-temperature annealing process, the first bonding pads 152 and the second bonding pads 252 may be bonded to each other by interdiffusion of a metal, for example, copper. That is, the first bonding pad 152 and the second bonding pad 252 may form a metal-to-metal bond. In this process, the first insulating layer 154 and the second insulating layer 254 may be combined with each other by a covalent bond formed between the insulating materials forming the first insulating layer 154 and the second insulating layer 254, for example, silicon oxide or silicon nitride. That is, the first insulating layer 154 and the second insulating layer 254 may form an insulator-to-insulator bond. Thus, hybrid-bonding between the first semiconductor structure 100 and the second semiconductor structure 200, that is, metal-to-metal bonding and insulator-to-insulator bonding may be achieved.

Here, the first conductive pattern 132, the first conductive plug 142, the first bonding pad 152, the second bonding pad 252, the second conductive plug 242, and the second conductive pattern 232 may form a daisy chain.

More specifically, each first conductive pattern 132 may be electrically connected to one second conductive pattern 232 through at least one of at least two first conductive plugs 142 connected thereto, the first bonding pad 152, the second bonding pad 252, and the second conductive plug 242 that are connected to the at least one of the at least two first conductive plugs 142, and may be electrically connected a different second conductive pattern 232 through at least another one of the at least two first conductive plugs 142 connected thereto, the first bonding pad 152, the second bonding pad 252, and the second conductive plug 242 that are connected to the at least another one of at least two first conductive plugs 142. Here, the one second conductive pattern 232 and the another second conductive pattern 232 to which each first conductive pattern 132 is simultaneously connected may be adjacent to each other in the first direction. For example, each first conductive pattern 132 may be connected to the second conductive pattern 232 that is positioned on a relatively left side in the first direction through the first conductive plug 142, the first bonding pad 152, the second bonding pad 252, and the second conductive plug 242 that are positioned on a relatively left side, and the second conductive pattern 232 that is positioned relatively on a right side in the first direction through the first conductive plug 142, the first bonding pad 152, the second bonding pad 252, and the second conductive plug 242 that are positioned on a relatively right side.

Similarly, each of the remaining second conductive patterns 232, except for the two second conductive patterns 232 positioned at both ends in the first direction, may be electrically connected to one first conductive pattern 132 through at least one of at least two second conductive plugs 242 connected thereto, the second bonding pad 252, the first bonding pad 152, and the first conductive plug 142 that are connected to the at least one of the at least two second conductive plugs 242, and may be electrically connected to another first conductive pattern 132 through at least another one of the at least two second conductive plugs 242 connected thereto, the second bonding pad 252, the first bonding pad 152, and the first conductive plug 142 that are connected to the at least another one of the at least two second conductive plugs 242. Here, the one first conductive pattern 132 and the another first conductive pattern 132 to which the second conductive patterns 232 are simultaneously connected may be adjacent to each other in the first direction. For example, each of the second conductive patterns 232 may be connected to the first conductive pattern 132 that is positioned on a relatively left side in the first direction through the second conductive plug 242, the second bonding pad 252, the first bonding pad 152, and the first conductive plug 142 that are positioned on a relatively left side, and may be connected to the first conductive pattern 132 that is positioned relatively on a right side in the first direction through the second conductive plug 242, the second bonding pad 252, the first bonding pad 152, and the first conductive plug 142 that are positioned on a relatively right side. The two second conductive patterns 232 located at both ends in the first direction may correspond to the start and end points of the daisy chain, respectively. The second conductive patterns 232 positioned on one end, for example a left end, may be electrically connected to the first conductive pattern 132 positioned on a left end through at least one second conductive plug 242 connected thereto, the second bonding pad 252, the first bonding pad 152, and the first conductive plug 142 that are connected to the at least one second conductive plug 242, and the other second conductive patterns 232 positioned on the other end, for example a right end, may be electrically connected to the first conductive pattern 132 positioned on a right end through at least one second conductive plug 242 connected thereto, the second bonding pad 252, the first bonding pad 152, and the first conductive plug 142 that are connected to the at least one second conductive plug 242.

This daisy chain may be formed to verify whether electrical connection between the first semiconductor structure 100 and the second semiconductor structure 200 is formed. When the plurality of first bonding pads 152 of the first semiconductor structure 100 and the plurality of second bonding pads 252 of the second semiconductor structure 200 are bonded and connected to each other, current may flow through the daisy chain. And, in this case, it may be determined that the electrical connection between the first semiconductor structure 100 and the second semiconductor structure 200 is formed. In order to verify whether current flow through the daisy chain is possible, it may be necessary to form through electrodes respectively connected to the two second conductive patterns 232 positioned at both ends in the first direction in the semiconductor device of FIG. 3A. This embodiment will be described with reference to FIG. 4.

Figure 4:
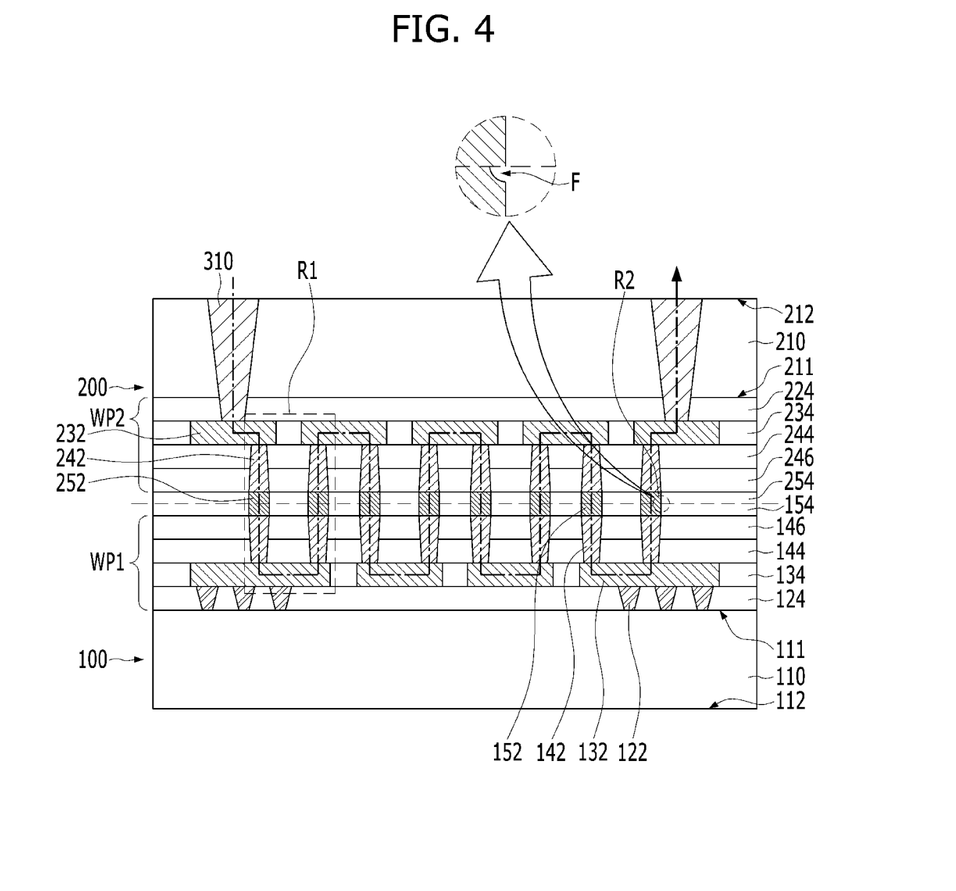
FIG. 4 is a cross-sectional view illustrating a semiconductor device in which through electrodes are further formed in the semiconductor device of FIG. 3A.

FIG. 4 is a cross-sectional view illustrating a semiconductor device in which through electrodes are further formed in the semiconductor device of FIG. 3A.

Referring to FIG. 4, a semiconductor device of the present embodiment may further include two through electrodes 310 respectively connected to the two second conductive patterns 232 positioned at both ends in the first direction. The through electrodes 310 may penetrate the second semiconductor substrate 210 and the interlayer insulating layer 224 under the first surface 211 of the second semiconductor substrate 210.

The through electrode 310 may have a columnar shape having one surface exposed from the second surface 212 of the second semiconductor substrate 210 and the other surface connected to the second conductive pattern 232. For example, the through electrode 310 may include various conductive materials. The conductive materials for the through electrode 310 may include a silicon-containing material such as through silicon via (TSV) and, for example, a metal such as copper (Cu), tin (Sn), silver (Ag), tungsten (W), nickel (Ni), ruthenium (Ru), cobalt (Co), or the like, or a compound of this metal.

The through electrode 310 may be formed by forming a trench exposing the second conductive pattern 232 by etching the second semiconductor substrate 210 and the interlayer insulating layer 224 from the second surface 212 of the second semiconductor substrate 210, and filling the trench with a conductive material. At this time, a large amount of charge may be generated during the etching process, and this charge may escape to the first semiconductor substrate 110 through the second conductive pattern 232, the second conductive plug 242, the second bonding pad 252, the first bonding pad 152, the first conductive plug 142, the first conductive pattern 132, and the connection pattern 122. That is, the connection pattern 122 may not be a component of the daisy chain, but may be a component for withdrawing charge to the first semiconductor substrate 110.

When different voltages are applied to the two through electrodes 310, current may flow from one through electrode 310 toward the other through electrode 310 through the daisy chain (see the dotted line arrow). This current may flow when the plurality of first bonding pads 152 is normally connected to the plurality of second bonding pads 252, respectively. If at least one of the plurality of first bonding pads 152 is not connected to a corresponding second bonding pad 252, this current flow may be cut off. When current flows from one through electrode 310 toward the other through electrode 310 via the daisy chain, it may be determined that electrical connection between the first semiconductor structure 100 and the second semiconductor structure 200 is formed. Conversely, when current does not flow from one through electrode 310 toward the other through electrode 310 via the daisy chain, it may be determined that electrical connection between the first semiconductor structure 100 and the second semiconductor structure 200 is not formed.

Meanwhile, in order for the first bonding pad 152 and the second bonding pad 252 to be normally connected, it may be necessary for the first bonding pad 152 and the second bonding pad 252 to be aligned with each other. However, misalignment may actually occur during the fabricating processes, and problems in this case will be described in more detail with reference to FIG. 5.

Figure 5:
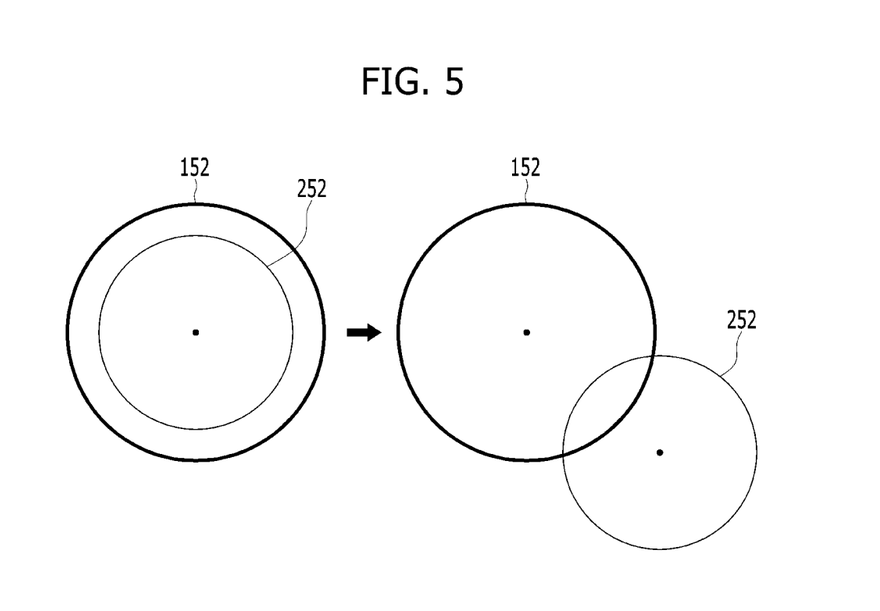
FIG. 5 is a view illustrating alignment between the first bonding pad and the second bonding pad of the semiconductor device of FIG. 4.

FIG. 5 is a view illustrating alignment between the first bonding pad and the second bonding pad of the semiconductor device of FIG. 4.

Referring to FIG. 5, as shown on the left side of the arrow, when the first bonding pad 152 and the second bonding pad 252 are properly aligned, their centers may substantially coincide with and/or overlap each other. For reference, the alignment may depend on whether the centers coincide, and may be independent of the sizes of the first and second bonding pads 152 and 252 in a plan view. In the present embodiment, the size of the first bonding pad 152 is shown to be larger than the size of the second bonding pad 252, but the invention of the present disclosure is not limited thereto. The size of the first bonding pad 152 may be smaller than the size of the second bonding pad 252, or the size of the first bonding pad 152 may be the same or substantially the same, as the size of the second bonding pad 252.

On the other hand, as shown on the right side of the arrow, when the first bonding pad 152 and the second bonding pad 252 are misaligned, their centers may not substantially coincide with and/or overlap each other. In this case, as shown, an overlapping area of the first bonding pad 152 and the second bonding pad 252 in a plan view may be reduced. If the overlapping area is too small, the first bonding pad 152 and the second bonding pad 252 may not be electrically connected. Alternatively, even if the first bonding pad 152 and the second bonding pad 252 partially overlap each other in a plan view as shown, a fang phenomenon in which the edge of the first bonding pad 152 and/or the second bonding pad 252 are sunken during the process, may occur. Accordingly, the first bonding pad 152 and the second bonding pad 252 may not be electrically connected because there is substantially no contact portion between them. An example of the fang phenomenon is shown in a part R2 of FIG. 4. Alternatively, unlike the drawing, the first bonding pad 152 and the second bonding pad 252 may not be electrically connected because they do not overlap each other in a plan view.

In any case, when the first bonding pad 152 and the second bonding pad 252 are not electrically connected, a path through which charges generated in the etching process for forming the through electrode 310 described above escape to the first semiconductor substrate 110 may be cut off. If the charges do not escape, the charge may be accumulated, and thus, a type of burst phenomenon called arching may occur. In this case, the first semiconductor structure 100 and/or the second semiconductor structure 200 may become defective structures that can no longer be used.

In the following embodiment, a bonding pad structure enabling electrical connection between a first bonding pad and a second bonding pad may be provided, even if misalignment between the first bonding pad and the second bonding pad occurs.

Figure 6:
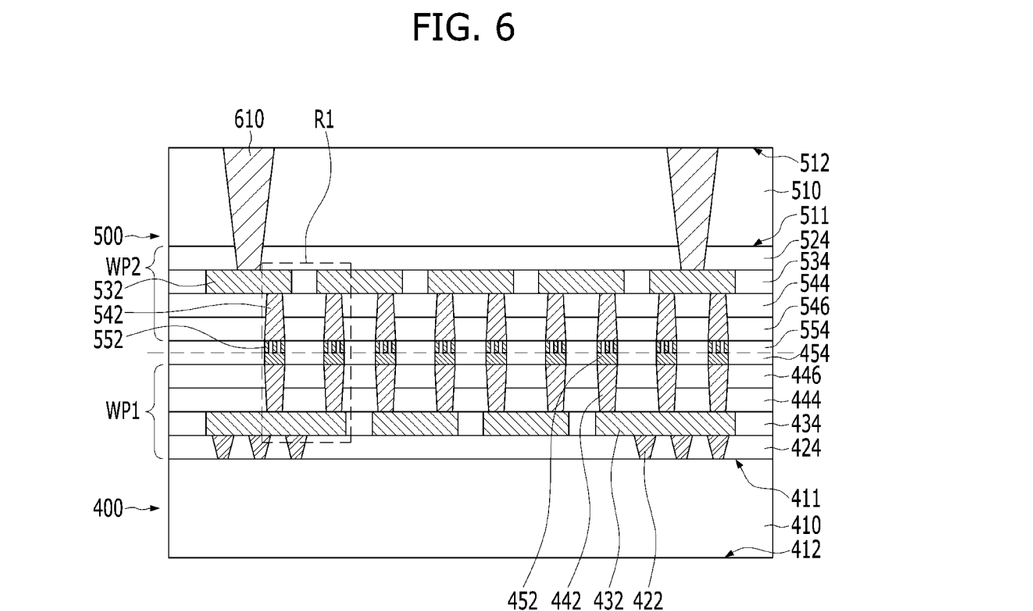
FIG. 6 is a cross-sectional view illustrating a semiconductor device according to another embodiment of the present disclosure.
Figure 7:
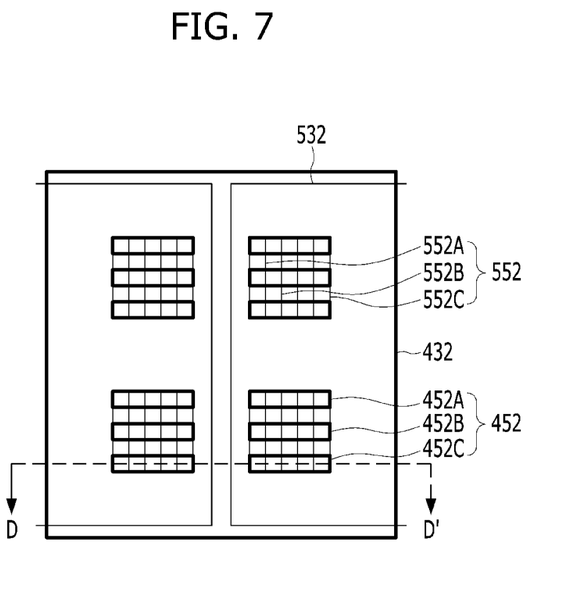
FIG. 7 is a plan view corresponding to a part R1 of FIG. 6.

FIG. 6 is a cross-sectional view illustrating a semiconductor device according to another embodiment of the present disclosure, and FIG. 7 is a plan view corresponding to a part R1 of FIG. 6. The part R1 of FIG. 6 is taken along a line D-D' of FIG. 7. Detailed descriptions of parts the same or substantially the same, as those of the aforementioned embodiment will be omitted.

Referring to FIGS. 6 and 7, a semiconductor device of the present embodiment may include a first semiconductor structure 400, a second semiconductor structure 500 disposed over the first semiconductor structure 400, and through electrodes 610.

The first semiconductor structure 400 may include a first semiconductor substrate 410, a connection pattern 422, a first conductive pattern 432, a first conductive plug 442, interlayer insulating layers 424, 434, 444, and 446, a first bonding pad 452, and a first insulating layer 454. Here, except for the first bonding pad 452 and the first insulating layer 454, components of the first semiconductor structure 400 may be the same or substantially the same, as the corresponding components of the first semiconductor structure 100 of the above-described embodiment.

The second semiconductor structure 500 may include a second semiconductor substrate 510, a second conductive pattern 532, a second conductive plug 542, interlayer insulating layers 524, 534, 544, and 546, a second bonding pad 552, and a second insulating layer 554. Here, except for the second bonding pad 552 and the second insulating layer 554, components of the second semiconductor structure 500 may be the same or substantially the same, as the corresponding components of the second semiconductor structure 200 of the above-described embodiment.

The through electrode 610 may be the same or substantially the same, as the through electrode 310 of the above-described embodiment.

Here, the first bonding pad 452 may include a plurality of first sub-bonding pads 452A, 452B, and 452C that are separated from each other. Each of the plurality of first sub-bonding pads 452A, 452B, and 452C may have a bar shape or a shape similar thereto in which a length in one direction is longer than a length in another direction crossing the one direction. For example, each of the plurality of first sub-bonding pads 452A, 452B, and 452C may have a bar shape in which a length in a first direction parallel to the line D-D' is greater than a length in a second direction perpendicular to the line D-D'. The plurality of first sub-bonding pads 452A, 452B, and 452C may be spaced apart from each other in the second direction. In addition, although three first sub-bonding pads 452A, 452B, and 452C are illustrated in the present embodiment, the number of first sub-bonding pads may be variously modified. The plurality of first sub-bonding pads 452A, 452B, and 452C may commonly contact and be connected to a corresponding first conductive plug 442. The first insulating layer 454 may be formed to fill a space between the first sub-bonding pads 452A, 452B, and 452C.

In addition, the second bonding pad 552 may include a plurality of second sub-bonding pads 552A, 552B, and 552C that are separated from each other. Each of the plurality of second sub-bonding pads 552A, 552B, and 552C may have a bar shape or a shape similar thereto in which a length in one direction is longer than a length in another direction crossing the one direction. Here, directions of the long sides of the plurality of second sub-bonding pads 552A, 552B, and 552C may intersect with directions of the long sides of the plurality of first sub-bonding pads 452A, 452B, and 452C. For example, each of the plurality of second sub-bonding pads 552A, 552B, and 552C may have a bar shape in which a length in the first direction is shorter than a length in the second direction. The plurality of second sub-bonding pads 552A, 552B, and 552C may be spaced apart from each other in the first direction. In addition, although three second sub-bonding pads 552A, 552B, and 552C are shown in the present embodiment, the number of second sub-bonding pads may be variously modified. Furthermore, the number of second sub-bonding pads may be the same as the number of first sub-bonding pads. As shown in the cross-sectional view, the plurality of second sub-bonding pads 552A, 552B, and 552C may commonly contact and be connected to a corresponding second conductive plug 542. The second insulating layer 554 may be formed to fill a space between the second sub-bonding pads 552A, 552B, and 552C.

The plurality of first sub-bonding pads 452A, 452B, and 452C may be connected to the plurality of corresponding second sub-bonding pads 552A, 552B, and 552C by metal-to-metal bonding, and the first insulating layer 454 and the second insulating layer 554 may be connected to each other by insulator-to-insulator bonding.

In this embodiment, even if misalignment between the first bonding pad 452 and the second bonding pad 552 occurs, the first bonding pad 452 and the second bonding pad 552 may still be electrically connected. This will be described in more detail with reference to FIG. 8.

Figure 8:
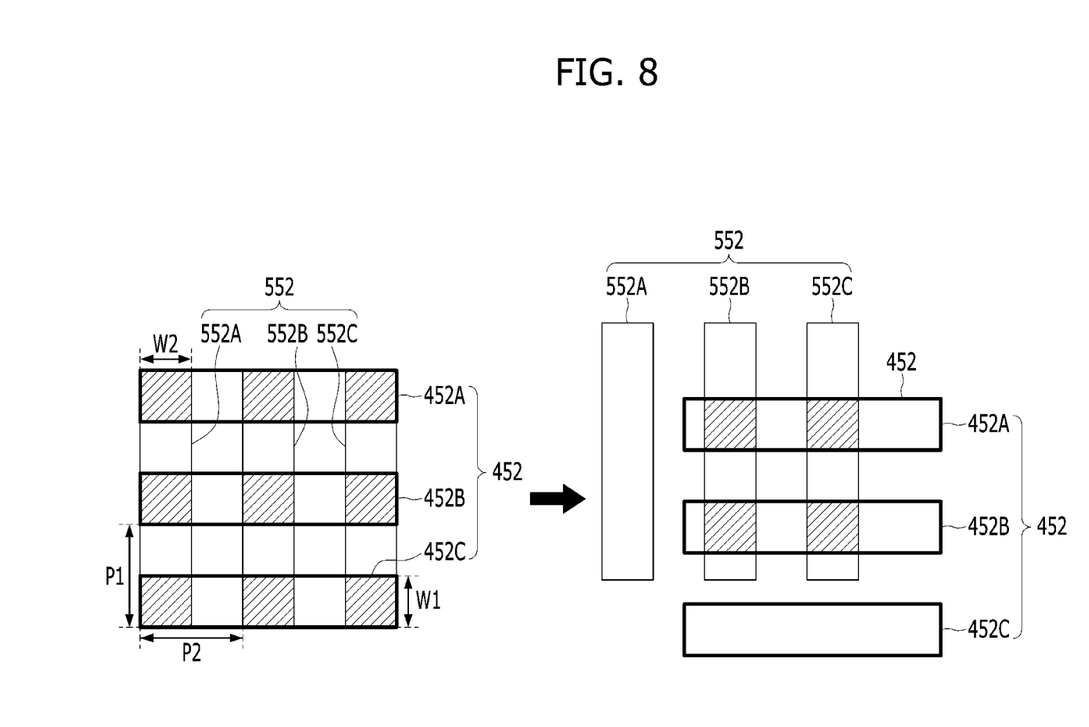
FIG. 8 is a view illustrating alignment between the first bonding pad and the second bonding pad of the semiconductor device of FIG. 6.

FIG. 8 is a view illustrating alignment between the first bonding pad and the second bonding pad of the semiconductor device of FIG. 6.

Referring to FIG. 8, as shown on the left side of the arrow, when the first bonding pad 452 and the second bonding pad 552 are properly aligned, all of the plurality of first sub-bonding pads 452A, 452B, and 452C constituting the first bonding pad 452 may overlap and contact all of the plurality of second sub-bonding pads 552A, 552B, and 552C constituting the second bonding pad 552. When the three first sub-bonding pads 452A, 452B, and 452C and the three second sub-bonding pads 552A, 552B, and 552C overlap and contact each other, nine contact portions (see hatched arrows) may be formed.

The length of each of the plurality of first sub-bonding pads 452A, 452B, and 452C in the second direction will be hereinafter referred to as a width. This width may be constant or substantially constant and be designated W1. A distance from one of the plurality of first sub-bonding pads 452A, 452B, and 452C to an adjacent one of the plurality of first sub-bonding pads 452A, 452B, and 452C in the second direction will be referred to as a pitch of the first sub-bonding pads 452A, 452B, and 452C. This pitch may be constant or substantially constant and be designated P1. The length of each of the plurality of second sub-bonding pads 552A, 552B, and 552C in the first direction will be hereinafter referred to as a width. This width may be constant or substantially constant and be designated W2. This width W2 may be the same or substantially the same, as the width W1. A distance from one of the plurality of second sub-bonding pads 552A, 552B, and 552C to an adjacent one of the plurality of second sub-bonding pads 552A, 552B, and 552C in the first direction will be referred to as a pitch of the second sub-bonding pads 552A, 552B, and 552C. This pitch may be constant or substantially constant and be designated P2. The pitch P2 may be the same or substantially the same, as the pitch P1.

The width W1 and length of each of the first sub-bonding pads 452A, 452B, and 452C may be the same or substantially the same, as the respective width W2 and length of each of the second sub-bonding pads 552A, 552B, and 552C. The number of the first sub-bonding pads 452A, 452B, and 452C may be equal to the number of the second sub-bonding pads 552A, 552B, and 552C. The pitch P1 of the first sub-bonding pads 452A, 452B, and 452C may be the same or substantially the same, as the pitch P2 of the second sub-bonding pads 552A, 552B, and 552C. In this case, both short sides of each of the first sub-bonding pads 452A, 452B, and 452C in the first direction may be aligned with the long sides of the second sub-bonding pads 552A and 552C located at both ends, and both short sides of each of the second sub-bonding pads 552A, 552B and 552C in the second direction may be aligned with the long sides of the first sub-bonding pads 452A and 452C located at both ends.

On the other hand, as shown on the right side of the arrow, when the first bonding pad 452 and the second bonding pad 552 are misaligned, at least one of the plurality of first sub-bonding pads 452A, 452B, and 452C constituting the first bonding pad 452 may not overlap or contact at least one of the plurality of second sub-bonding pads 552A, 552B, and 552C constituting the second bonding pad 552. For example, as shown, the first sub-bonding pad 452C positioned at the bottom of the first sub-bonding pads 452A, 452B, and 452C may not have a portion overlapping the second bonding pad 552, and the second sub-bonding pad 552A positioned at the left side of the second sub-bonding pads 552A, 552B, and 552C may not have a portion overlapping the first bonding pad 452. Accordingly, only four contact portions indicated by the see hatched areas may be formed. However, even in this case, since contact between the first bonding pad 452 and the second bonding pad 552 is secured, electrical connection between the first bonding pad 452 and the second bonding pad 552 may still be formed. Furthermore, since each of the plurality of first sub-bonding pads 452A, 452B, and 452C and the plurality of second sub-bonding pads 552A, 552B, and 552C has a bar shape, a fang phenomenon may be less likely to occur compared to a case in which a first bonding pad or a second bonding pad has a plate shape, and thus, problems due to the fang phenomenon may be removed.

As a result, since the first bonding pad 452 and the second bonding pad 552 are electrically connected, a path through which charges generated during the etching process for forming the through electrode 610 escape to the first semiconductor substrate 410 may be secured. This may prevent the first semiconductor structure 100 and/or the second semiconductor structure 200 from being defective structures.

Meanwhile, the shape of the bonding pads as described in FIG. 8 is not applied only to a semiconductor device having a daisy chain structure as shown in FIG. 6. In the case of bonding the bonding pads of two semiconductor structures to each other, it may be applied to all semiconductor devices requiring electrical connection between the bonding pads even if misalignment occurs between the bonding pads.

According to the above embodiments of the present disclosure, it may be possible to provide a semiconductor device capable of easily electrically connecting two semiconductor structures and verifying the electrical connection between the two semiconductor structures while preventing process defects.

Although various embodiments have been described for illustrative purposes, it will be apparent to those skilled in the art that various changes and modifications may be made without departing from the spirit and scope of the present disclosure as defined in the following claims.

What is claimed is:

1. A semiconductor device comprising:
   a first semiconductor structure including a first semiconductor substrate, one or more first conductive patterns disposed over the first semiconductor substrate, a plurality of first conductive plugs connected to each of the one or more first conductive patterns thereover, and a first bonding pad connected to each of the plurality of first conductive plugs thereover;
   a second semiconductor structure including a second semiconductor substrate, a plurality of second conductive patterns disposed under the second semiconductor substrate, one or more second conductive plugs connected to each of the plurality of second conductive patterns thereunder, and a second bonding pad connected to each of the one or more second conductive plugs thereunder; and
   two through electrodes penetrating the second semiconductor substrate and respectively connected to two second conductive patterns positioned at opposite ends of the plurality of second conductive patterns,
   wherein the second bonding pad is bonded to the first bonding pad so that the plurality of second conductive patterns, the one or more second conductive plugs, the second bonding pad, the first bonding pad, the plurality of first conductive plugs, and the one or more first conductive patterns form a daisy chain.

2. The semiconductor device according to claim 1, wherein electrical connection between the first semiconductor structure and the second semiconductor structure is verified according to whether current flows through one of the two through electrodes, the daisy chain, and the other of the two through electrodes.

3. The semiconductor device according to claim 1, wherein the first semiconductor structure further includes a connection pattern interposed between at least one of the one or more first conductive patterns and the first semiconductor substrate to electrically connect them.

4. The semiconductor device according to claim 3, wherein charges escape to the first semiconductor substrate through the connection pattern.

5. The semiconductor device according to claim 1, wherein the second bonding pad and the first bonding pad form a metal-to-metal bond.

6. The semiconductor device according to claim 5, wherein the first semiconductor structure further includes a first insulating layer filling a space between the first bonding pad and another first bonding pad,
  wherein the second semiconductor structure further includes a second insulating layer filling a space between the second bonding pad and another second bonding pad, and
  wherein the first insulating layer and the second insulating layer form an insulator-to-insulator bond.

7. The semiconductor device according to claim 1, wherein the first bonding pad has a plate shape connected to a corresponding one of the plurality of first conductive plugs, and
  wherein the second bonding pad has a plate shape connected to a corresponding one of the one or more second conductive plugs.

8. The semiconductor device according to claim 1, wherein the first bonding pad includes a plurality of first sub-bonding pads separated from each other,
  wherein the second bonding pad includes a plurality of second sub-bonding pads separated from each other, and
  wherein at least one of the plurality of first sub-bonding pads and at least one of the plurality of second sub-bonding pads overlap and contact each other.

9. The semiconductor device according to claim 8, wherein each of the plurality of first sub-bonding pads has a long side in a first direction and a short side in a second direction crossing the first direction, and
  wherein each of the plurality of second sub-bonding pads has a short side in the first direction and a long side in the second direction.

10. The semiconductor device according to claim 9, wherein a length of the long side of each of the plurality of first sub-bonding pads is equal to a length of the long side of each of the plurality of second sub-bonding pads,
  wherein a length of the short side of each of the plurality of first sub-bonding pads is equal to a length of the short side of each of the plurality of second sub-bonding pads, and
  wherein a number and pitch of the plurality of first sub-bonding pads are equal to a number and pitch of the plurality of second sub-bonding pads.

11. The semiconductor device according to claim 8, wherein the plurality of first sub-bonding pads are commonly connected to a corresponding one of the plurality of first conductive plugs, and
  wherein the plurality of second sub-bonding pads are commonly connected to a corresponding one of the one or more second conductive plugs.

12. The semiconductor device according to claim 1, wherein the first semiconductor structure and the second semiconductor structure include the same type of memory.

13. The semiconductor device according to claim 1, wherein the first semiconductor structure and the second semiconductor structure include different types of memory.

* * * * *